(12) United States Patent
Kihara et al.

(10) Patent No.: US 10,233,535 B2
(45) Date of Patent: Mar. 19, 2019

(54) PLASMA PROCESSING APPARATUS AND PLASMA PROCESSING METHOD

(71) Applicant: Tokyo Electron Limited, Tokyo (JP)

(72) Inventors: Yoshihide Kihara, Miyagi (JP); Masanobu Honda, Miyagi (JP); Toru Hisamatsu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 14/799,650

(22) Filed: Jul. 15, 2015

(65) Prior Publication Data

US 2016/0032445 A1  Feb. 4, 2016

(30) Foreign Application Priority Data

Jul. 29, 2014 (JP) ................................. 2014-153894

(51) Int. Cl.
*C23C 14/34* (2006.01)
*C23C 14/00* (2006.01)
(Continued)

(52) U.S. Cl.
CPC .......... *C23C 14/34* (2013.01); *C23C 14/0021* (2013.01); *C23C 14/0036* (2013.01); *C23C 14/06* (2013.01); *C23C 14/0605* (2013.01); *C23C 14/0694* (2013.01); *C23C 14/345* (2013.01); *C23C 14/3414* (2013.01); *C23C 14/3435* (2013.01); *C23C 16/30* (2013.01); *C23C 16/44* (2013.01); *C23C 16/448* (2013.01);
(Continued)

(58) Field of Classification Search
CPC . C23C 14/0036; C23C 14/0021; C23C 16/44; C23C 16/448; C23C 16/505
See application file for complete search history.

(56) References Cited

U.S. PATENT DOCUMENTS

2002/0089027 A1*  7/2002  Xu ...................... C23C 14/0036
257/471
2003/0116427 A1*  6/2003  Ding .................... C23C 14/046
204/192.17
(Continued)

FOREIGN PATENT DOCUMENTS

JP    2004-266112    9/2004
JP    2008-021791    1/2008
(Continued)

*Primary Examiner* — Jason Berman
(74) *Attorney, Agent, or Firm* — IPUSA, PLLC

(57) ABSTRACT

A plasma processing apparatus includes a first electrode, a second electrode disposed to face the first electrode, a chamber, a first high-frequency power supply, a direct-current power supply, and a gas supply source. The plasma processing apparatus generates first plasma to form a film of a reaction product on the second electrode by causing the first high-frequency power supply to supply first high-frequency power to the second electrode and causing the gas supply source to supply a first gas into the chamber; and generates second plasma to sputter the film of the reaction product by causing the first high-frequency power supply to supply the first high-frequency power to the second electrode, causing the direct-current power supply to supply direct-current power to the second electrode, and causing the gas supply source to supply a second gas into the chamber.

9 Claims, 3 Drawing Sheets

(51) Int. Cl.
　　　*C23C 16/505*　　　(2006.01)
　　　*C23C 16/44*　　　(2006.01)
　　　*C23C 16/448*　　　(2006.01)
　　　*H01J 37/34*　　　(2006.01)
　　　*C23C 14/06*　　　(2006.01)
　　　*C23C 16/30*　　　(2006.01)
　　　*C23C 16/509*　　　(2006.01)
　　　*H01J 37/32*　　　(2006.01)

(52) U.S. Cl.
　　　CPC .......... *C23C 16/505* (2013.01); *C23C 16/509* (2013.01); *H01J 37/32568* (2013.01); *H01J 37/32577* (2013.01); *H01J 37/3414* (2013.01); *H01J 37/3417* (2013.01); *H01J 37/3426* (2013.01); *H01J 37/3432* (2013.01); *H01J 37/3438* (2013.01); *H01J 37/3491* (2013.01)

(56) References Cited

U.S. PATENT DOCUMENTS

| | | |
|---|---|---|
| 2003/0209422 A1 | 11/2003 | Wang et al. |
| 2005/0023130 A1 | 2/2005 | Suzuki et al. |
| 2005/0029088 A1* | 2/2005 | Delahoy ................ C23C 14/08 204/192.12 |

FOREIGN PATENT DOCUMENTS

| | | |
|---|---|---|
| JP | 2008-028022 | 2/2008 |
| JP | 2009-280916 | 12/2009 |
| JP | 2011-103489 | 5/2011 |
| WO | 2012/015656 | 2/2012 |
| WO | 2012/036936 | 3/2012 |

* cited by examiner

PLASMA PROCESSING APPARATUS AND PLASMA PROCESSING METHOD

CROSS-REFERENCE TO RELATED APPLICATION

The present application is based upon and claims the benefit of priority of Japanese Patent Application No. 2014-153894, filed on Jul. 29, 2014, the entire contents of which are incorporated herein by reference.

BACKGROUND OF THE INVENTION

1. Field of the Invention

An aspect of this disclosure relates to a plasma processing apparatus and a plasma processing method.

2. Description of the Related Art

There has been proposed a film-deposition method where a film is formed by applying direct-current power to a target material and sputtering the target material (see, for example, Japanese Laid-Open Patent Publications No. 2009-280916 and No. 2004-266112). For example, Japanese Laid-Open Patent Publication No. 2009-280916 discloses a sputter deposition method where a film is formed on an inner wall of, for example, a contact hole, a through hole, or a wiring groove by applying pulsed direct-current power to a target material.

SUMMARY OF THE INVENTION

In an aspect of this disclosure, there is provided a plasma processing apparatus that includes a first electrode on which a substrate is placed, a second electrode that is disposed to face the first electrode across a predetermined gap, a chamber that houses the first electrode and the second electrode, a first high-frequency power supply that supplies first high-frequency power to the second electrode, a direct-current power supply that supplies direct-current power to the second electrode, and a gas supply source. The plasma processing apparatus is configured to generate first plasma to form a film of a reaction product on the second electrode by causing the first high-frequency power supply to supply the first high-frequency power to the second electrode and causing the gas supply source to supply a first gas into the chamber; and generate second plasma to sputter the film of the reaction product on the second electrode by causing the first high-frequency power supply to supply the first high-frequency power to the second electrode, causing the direct-current power supply to supply the direct-current power to the second electrode, and causing the gas supply source to supply a second gas into the chamber.

DESCRIPTION OF THE PREFERRED EMBODIMENTS

In the related-art technologies of Japanese Laid-Open Patent Publications No. 2009-280916 and No. 2004-266112, a target material placed in a chamber is sputtered. Therefore, with the related-art technologies, it is difficult to use a sputter deposition method to form a film for which no target material suitable to be placed beforehand in a chamber is available.

Accordingly, there is a demand for an apparatus and a method that can form, by sputter deposition, a film (e.g., a film including carbon (C) and fluorine (F)) for which no target material suitable to be placed beforehand in a chamber is available.

An aspect of this disclosure provides a plasma processing apparatus and a plasma processing method that can form, by sputter deposition, a film for which no target material suitable to be placed beforehand in a chamber is available.

Embodiments of the present invention are described below with reference to the accompanying drawings. Throughout the specification and the drawings, the same reference number is assigned to substantially the same components, and repeated descriptions of those components are omitted.

<Configuration of Plasma Processing Apparatus>

Figure 1:
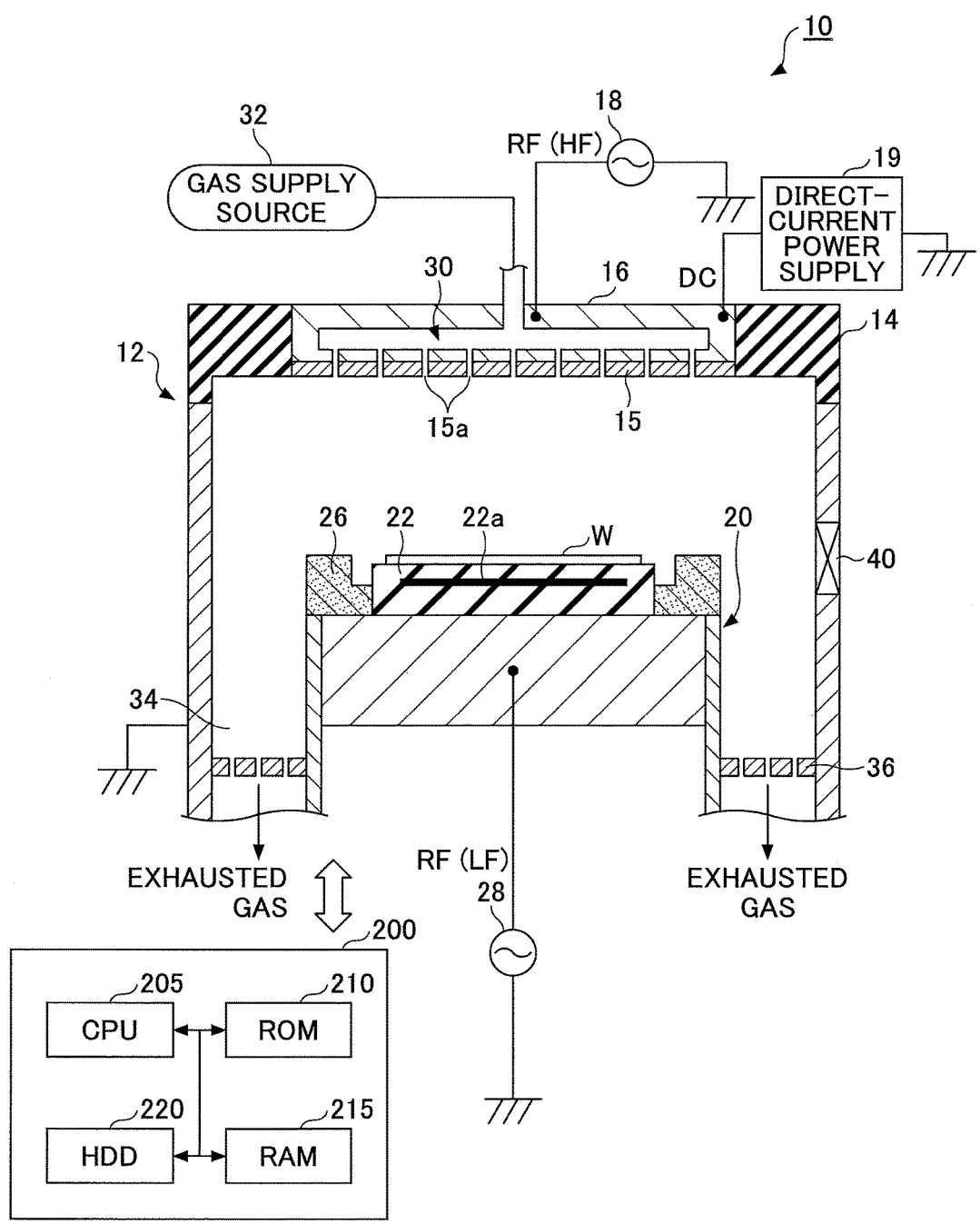
FIG. 1 is a drawing illustrating an exemplary configuration of a plasma processing apparatus.

An exemplary configuration of a plasma processing apparatus 10 according to an embodiment is described below with reference to FIG. 1. The plasma processing apparatus 10 includes a cylindrical chamber 12 comprised of a metal such as aluminum or stainless steel. The chamber 12 is grounded. An opening is formed at the upper end of the chamber 12. An upper electrode 15 is disposed at the opening via an insulator 14. The insulator 14 and the upper electrode 15 constitute a lid for closing the opening of the chamber 12.

A mount table 12, on which a semiconductor wafer W (which is hereafter simply referred to as a "wafer W") is to be placed, is provided in the chamber 12. The mount table 20 is comprised of, for example, aluminum and is supported via an insulating holder (not shown) by the chamber 12. An electrostatic chuck 22 for holding the wafer W is provided on an upper surface of the mount table 20. The electrostatic chuck 22 is configured to electrostatically attract and hold the wafer W on the mount table 20 with Coulomb force that is generated when direct-current power is applied to an electrode plate 22a of the electrostatic chuck 22. A focus ring 26 is provided to surround the wafer W. The focus ring 26 may be comprised of silicon or quartz.

A high-frequency power supply 28 is connected via a matching box (not shown) to the mount table 20. The high-frequency power supply 28 applies bias high-frequency power RF (LF) with a frequency of, for example, 400 kHz or greater to the mount table 20. With this configuration, the mount table 20 also functions as a lower electrode.

At the ceiling of the chamber 12, the upper electrode 15 and an electrode support 16 for supporting the upper electrode 15 are provided. A surface of the upper electrode 15 faces the mount table 20, and multiple gas holes 15a are formed in the surface of the upper electrode 15. The upper electrode 15 may be comprised of a material such as silicon (Si), silicon carbide (SiC), or quartz ($SiO_2$). The electrode support 16 supports the upper electrode 15, and may be comprised of a conductive material such as aluminum.

A gas output from a gas supply source 32 flows through a gas diffusion chamber 30 and is supplied in the form of a shower into the chamber 12 from the gas holes 15a. Thus, the upper electrode 15 also functions as a shower head.

High-frequency power RF (HF) for plasma generation with a frequency of, for example, 60 MHz is applied from a high-frequency power supply 18 via a matching box (not shown) to the upper electrode 15. With this configuration, the high-frequency power from the high-frequency power supply 18 is applied to a "capacitor" formed between the mount table 20 and the shower head. The high-frequency power supply 18 supplies high-frequency power with a frequency higher than the frequency of the high-frequency power supplied by the high-frequency power supply 28.

The lower electrode (mount table 20) is an example of a first electrode on which the wafer W is placed. The upper electrode 15 is an example of a second electrode that is disposed to face the lower electrode. The high-frequency power supply 18 is an example of a first high-frequency power supply that supplies first high-frequency power to the upper electrode 15. The high-frequency power supply 28 is an example of a second high-frequency power supply that supplies second high-frequency power with a frequency lower than the first high-frequency power.

Sputtering described later is performed by applying direct-current (DC) power supplied from a direct-current power supply 19 to the upper electrode 15. In this case, the upper electrode 15 is preferably comprised of a silicon (Si) material. Sputtering may also be performed by applying bias high-frequency power with a frequency of, for example, about 400 kHz to the upper electrode 15. In this case, the upper electrode 15 is not necessarily comprised of silicon, but may instead be comprised of quartz. The direct-current power supply 19 is an example of a direct-current power supply that supplies direct-current power to the upper electrode 15.

An evacuation channel 34 is formed between a side wall of the mount table 20 and an inner wall of the chamber 12. A baffle board 36 is provided in the evacuation channel 34 to regulate the flow of gas. A gas in the chamber 12 is exhausted from the chamber 12 by an evacuation device (not shown) through the evacuation channel 34 to reduce the pressure in the chamber 12 to a predetermined vacuum pressure.

The plasma processing apparatus 10 also includes a controller 200 for controlling operations of the entire plasma processing apparatus 10. The controller 200 includes a central processing unit (CPU) 205, a read-only memory (ROM) 210, a random access memory (RAM) 215, and a hard disk drive (HDD) 220. The CPU 205 performs plasma processing described later according to various recipes. A recipe includes control information for controlling the plasma processing apparatus 10 to perform a process. For example, the control information includes process time, a pressure (gas exhaust), high-frequency power and voltage, flow rates of various process gases, and temperatures in a chamber (e.g., an upper electrode temperature, a temperature of a side wall of the chamber, and an ESC temperature). The recipes may be stored in the RAM 215, the HDD 220, or a semiconductor memory (not shown). Also, the recipes may be stored in a portable, computer-readable storage medium such as a compact disk read-only memory (CD-ROM) or a digital versatile disk (DVD).

An exemplary configuration of the plasma processing apparatus 10 of the present embodiment is described above. In the plasma processing apparatus 10 configured as described above, the wafer W is carried into the chamber 12 via a gate valve 40 and placed on the electrostatic chuck 22. In this state, gases and high-frequency power are supplied to generate plasma; and using the generated plasma, (1) an upper electrode film deposition process, (2) a wafer film deposition process, (3) an etching process, and (4) a wafer-less dry cleaning process are performed in sequence in the same chamber 12.

(1) Upper Electrode Film Deposition Process

In the upper electrode film deposition process of the present embodiment, the plasma processing apparatus 10 generates plasma by supplying a film deposition gas (first gas) and high-frequency power RF (HF) to the upper electrode 15. By the action of the generated plasma, a film of a reaction product is formed mainly on a lower surface of the upper electrode 15.

In the present embodiment, a gap between the upper electrode 15 and the mount table 20 is set at 80 mm or greater. With the wide gap set at 80 mm or greater, when the pressure in the chamber 12 is high (e.g., 13.3 Pa or higher), the gas density increases, the mean free path of gas molecules becomes short, and the frequency of molecular collisions becomes high. Because the frequency of collisions between radicals and ions in the plasma also becomes high, the plasma is deactivated and becomes unable to diffuse. Accordingly, the plasma is generated mainly near the upper electrode 15. For the above reasons, the reaction product generated from the plasma is deposited mostly on a plasma surface of the upper electrode 15 facing the mount table 20, and does not reach the upper surface of the wafer W. Thus, through the above process, a film of the reaction product is formed on the upper electrode 15.

The film of the reaction product formed on the upper electrode 15 may be, for example, a silicon (Si) film, a carbon (C) film, a CF film including carbon (C) and fluorine (F), a silicon-containing film such as an $SiO_2$ film, or a carbon-containing film.

For example, when a CF film is to be formed on the upper electrode 15, a single gas such as a $C_4F_8$ gas, a $CHF_3$ gas, or a $CH_2F_2$ gas, or a mixed gas including at least one of these gases may be supplied as the film deposition gas into the chamber 12.

Here, for a CF film in particular, there is no target material suitable to be placed beforehand in the chamber 12. With the plasma processing apparatus 10 of the present embodiment, it is possible to form a CF film on the wafer W by forming the CF film in the chamber 12 and then sputtering the CF film in the same chamber 12. Thus, the plasma processing apparatus 10 of the present embodiment can form a film by sputtering, regardless of the type of target material.

Also, when the upper electrode 15 is comprised of quartz ($SiO_2$), it is possible to form an SiO film on the wafer W by forming an Si film or an Si-containing film as a reaction product film on the upper electrode 15.

(2) Wafer Film Deposition Process

In the wafer film deposition process of the present embodiment, the plasma processing apparatus 10 generates plasma by supplying a sputtering gas (second gas), high-frequency power RF (HF), and direct-current power to the upper electrode 15. By the action of the generated plasma (particularly, by the bombardment of ions in the plasma), the film of the reaction product formed on the upper electrode 15 is sputtered. Thus, after the film of the reaction product is formed on the upper electrode 15 in the chamber 12, the film of the reaction product on the upper electrode 15 is sputtered in the same chamber 12. The sputtered reaction product is deposited on the wafer W placed on the mount table 20, and a uniform thin film is formed on the wafer W.

In addition to or instead of supplying the direct-current power to the upper electrode 15, high-frequency power RF (LF) may be supplied from the high-frequency power supply 28 to the mount table 20 (lower electrode) when sputtering the film of the reaction product.

Examples of the sputtering gas to be supplied into the chamber 12 include a single inert gas such as an argon (Ar) gas and a mixed inert gas such as a mixture of an argon gas and a hydrogen ($H_2$) gas.

The thickness of a sheath formed on the lower surface of the upper electrode 15 and the inner wall of the chamber 12 can be controlled by controlling the value of the direct-current power applied to the upper electrode 15. For example, compared with a case where the direct-current power is not applied, the thickness of the sheath becomes greater when the direct-current power is applied to the upper electrode 15. Also, the thickness of the sheath increases as the value of the applied direct-current power increases. As the thickness of the sheath increases, the sheath voltage increases, and ions in the plasma are accelerated in the sheath. This in turn makes it possible to cause the ions to strongly collide with the surface of the upper electrode 15, and thereby improve sputtering efficiency. Generally, the thickness of a sheath is determined by an acceleration voltage (a DC voltage or high-frequency power RF (LF) with a frequency lower than 1 MHz), a plasma density, and an electron temperature of plasma. Accordingly, it is possible to control a sputtering process by varying a sheath voltage by controlling the value of direct-current power.

As described above, in the plasma processing apparatus 10 of the present embodiment, a film of a target material such as a CF film, which is not suitable to be placed beforehand in the chamber 12, is formed on the upper electrode 15. Next, the film formed on the upper electrode 15 is sputtered to remove (or blow off) atoms and molecules in the film from the upper electrode 15. The removed atoms and molecules jump between the upper electrode 15 and the mount table 20, reach and adhere to the wafer W, and form a film on the wafer W.

For example, when a pattern of a resist film is formed on the wafer W, the atoms and molecules removed by the sputtering from the film on the upper electrode 15 fly to the wafer W and form a film on the resist film. This makes it possible to increase the width of the resist film by an amount corresponding to the thickness of the formed film. For example, when a CF film is formed as a reaction product film, a uniform thin CF film is formed on the resist film. As a result, in the next etching process performed using the resist film as a mask, the diameter of a hole or the width of a line to be etched is decreased by an amount corresponding to the increase in the width of the resist film. Thus, this approach enables fine processing As described above, in the present embodiment, a film of a reaction product to be used as a target material is formed on the upper electrode 15, and then the film is sputtered so that a uniform thin film is formed on the wafer W with diffused atoms and molecules of the sputtered film. As another method, a desired film may be directly formed on the wafer W by chemical vapor deposition (CVD).

As a technique for fine processing, there exists a pattern shrink technology that makes it possible to form patterns finer than those formed by lithography. In the pattern shrink technology, a pattern is etched by plasma etching using a deposition etching gas such that a desired deposit is formed on the etched pattern. This makes it possible to reduce, for example, the diameter of a hole and the width of a line formed by etching. However, the adherence of the deposit formed by plasma etching shows anisotropy, and the amount of deposit varies depending on the density of a pattern. More specifically, in an area where the pattern is thin, the amount of deposit becomes greater and the film thickness becomes greater; and in an area where the pattern is dense, the amount of deposit becomes smaller and the film thickness becomes smaller. This results in formation of an uneven film, and affects the next etching process. Thus, with the related-art pattern shrink technology, it will be difficult to meet the future demand for finer wafer processing.

There is a growing demand for further miniaturization, and the International Technology Roadmap for Semiconductors (ITRS) expects that miniaturization advances year by year. However, with the technology where a film is formed while performing etching using a deposition etching gas, it is difficult to form a uniform film that satisfies such a demand for miniaturization.

Also, it is thought that formation of lines with a half pitch (hp) of about 40 nm is the limit of the current ArF immersion exposure technology. Therefore, to form a finer pattern, a technique such as double patterning has been introduced. Thus, to meet the market needs, shrink technologies for forming patterns finer than those formed by lithography have become important.

(3) Etching Process

The plasma processing apparatus 10 of the present embodiment enables a shrink technology where a deposition process and a sputtering process for a target material are performed in the same chamber 12. This technology makes it possible to form a uniform film on a resist film, and to accurately perform an etching process that satisfies miniaturization demands. For example, the present embodiment makes it possible to form a uniform film with a thickness of about several nm to several tens nm on a fine resist film formed by double patterning. Thus, the present embodiment provides a technology that is particularly suitable to increase the fineness of a pattern formed by double patterning.

(4) Wafer-Less Dry Cleaning Process

After the etched wafer W is carried out of the chamber 12, it is preferable to perform a wafer-less dry cleaning (WLDC) process. For example, a CF film in the chamber 12 can be removed by using $O_2$ plasma. The processes (1) through (4) described above are performed in the same plasma processing apparatus 10.

<Plasma Processing Method>

Figure 2:
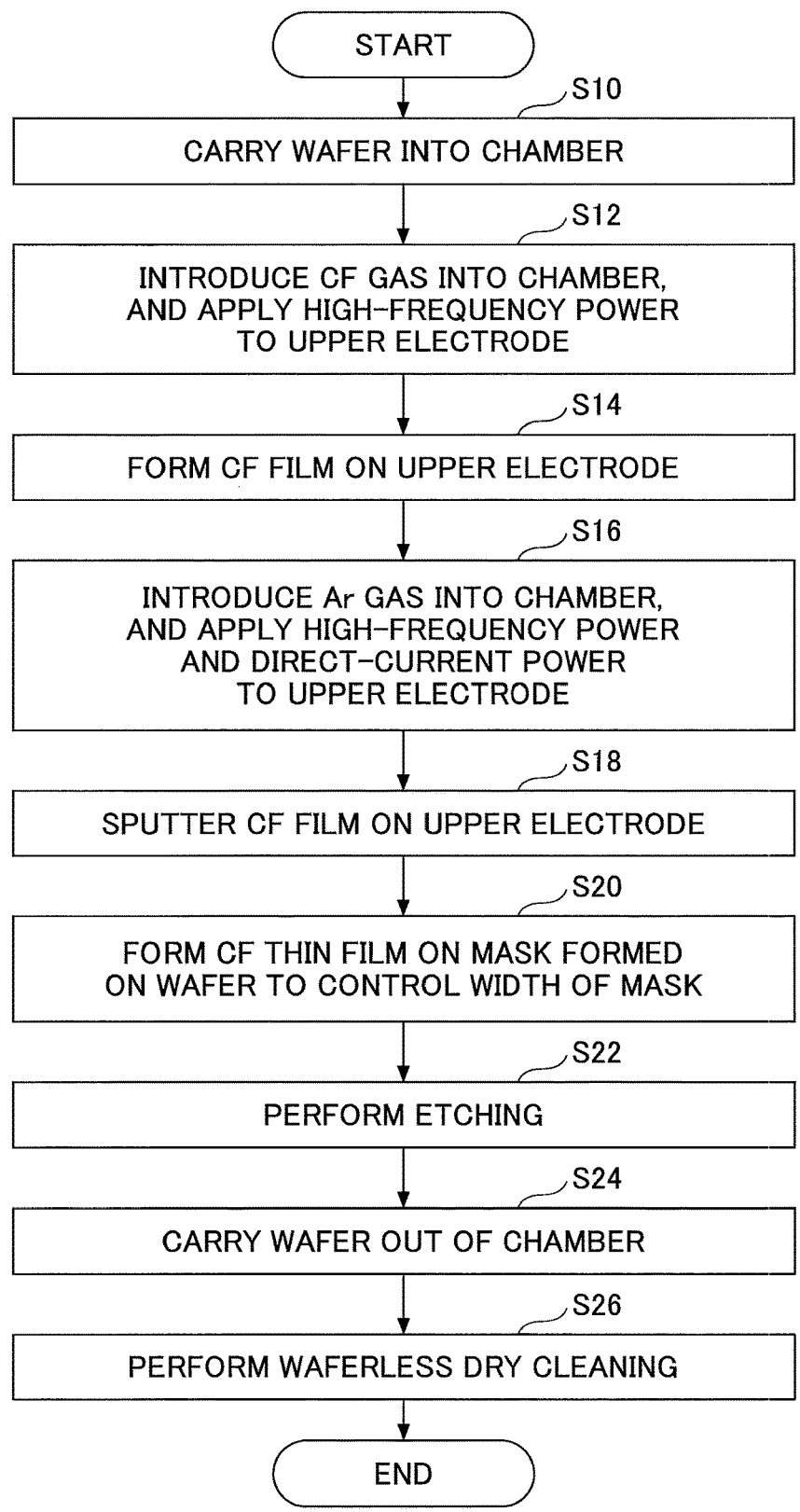
FIG. 2 is a flowchart illustrating an exemplary plasma processing method.

A plasma processing method of the present embodiment including the above described processes (1) through (4) is described below with reference to FIG. 2. The plasma processing method of the present embodiment can be performed by the plasma processing apparatus 10 of FIG. 1 or a different plasma processing apparatus.

When the plasma processing method is started, the wafer W is carried into the chamber 12 and placed on the mount table 20 (step S10).

Next, a gas (CF gas) including carbon (C) and fluorine (F) is introduced into the chamber 12, and high-frequency power RF (HF) is applied to the upper electrode 15 (step S12). As a result, from the CF gas, plasma including radicals and ions of C and F is generated.

Next, a CF film is formed on the upper electrode 15 by the generated plasma (step S14).

Next, an argon (Ar) gas is introduced into the chamber 12, and high-frequency power RF (HF) and direct-current (DC) power are applied to the upper electrode 15 (step S16). As a result, plasma is generated from the argon gas.

Next, the CF film on the upper electrode 15 is sputtered by the generated plasma (step S18).

Figure 3:
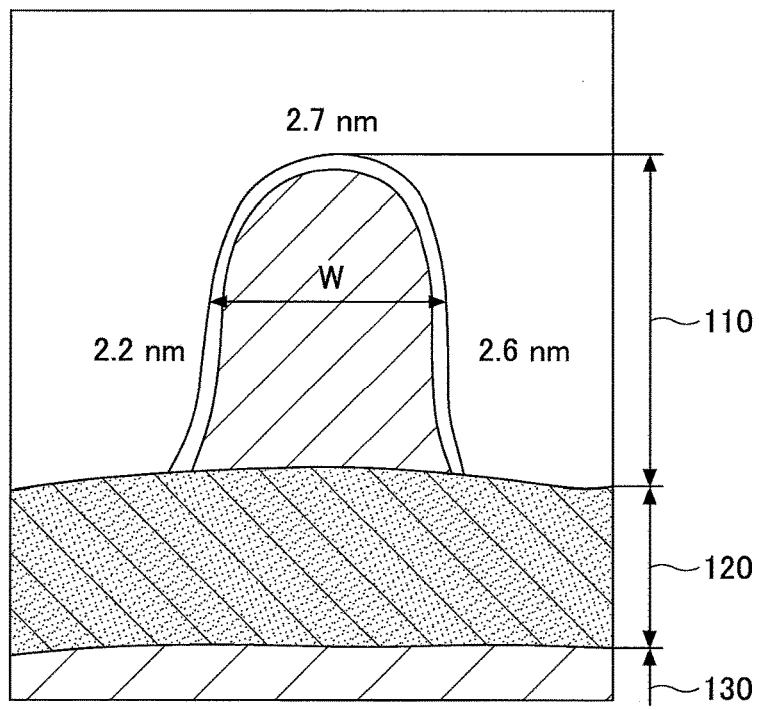
FIG. 3 is a drawing used to describe an effect of a plasma processing method of an embodiment.
Figure 4:
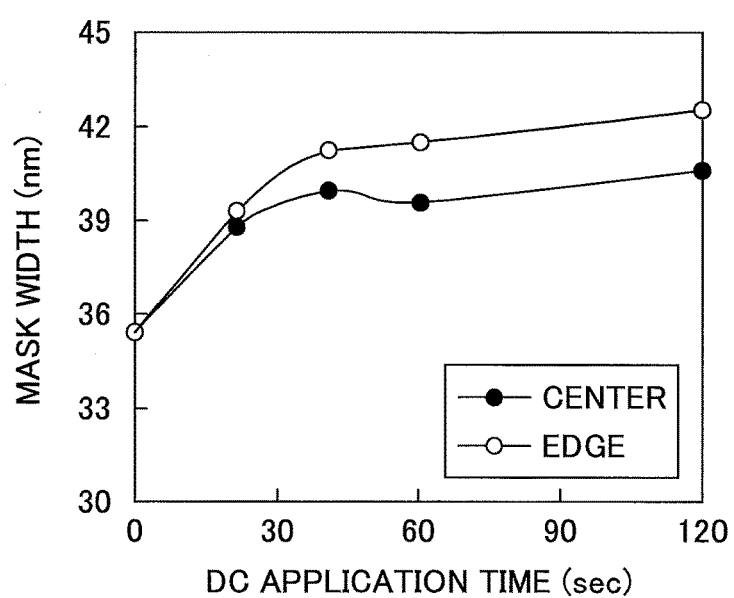
FIG. 4 is a graph illustrating a relationship between a direct-current application time and a mask width.

Atoms and molecules removed from the CF film as a result of the sputtering fly and adhere to the wafer W. As a result, a thin CF film is formed on a resist film (mask) formed on the wafer W. FIG. 3 illustrates exemplary films formed on the wafer W. In this example, an organic film 130, an anti-reflection film 120, and a patterned ArF resist film 110 are formed on the wafer W. The ArF resist film 110 functions as a mask. In the example of FIG. 3, a thin Si film with a thickness of several nm is formed on the ArF resist film 110. Thus, the plasma processing method of the present embodiment makes it possible to form a uniform thin film with a thickness of about several nm. FIG. 4 is a graph illustrating a relationship between a direct-current application time and a mask width. This graph indicates that it is possible to form a thin film with a thickness of about 2.5 nm on a mask and thereby increase the width of the mask by about 5 nm by applying direct-current voltage for about 30 seconds. Thus, the plasma processing method of the present embodiment makes it possible to form a uniform thin film on a patterned mask formed on the wafer W to control a width W of the mask, and thereby makes it possible to form a finer pattern in the next etching process.

Referring back to FIG. 2, after step S20, etching is performed (step S22). After the etching, the wafer W is carried out of the chamber 12 (step S24). Then, wafer-less dry cleaning is performed (step S26), and the process ends.

A plasma processing method according to the present embodiment is described above. However, the plasma processing method described above is just an example and may be modified. For example, although high-frequency power RF (HF) for plasma generation and direct-current power are applied to the upper electrode 15 at step S16 in FIG. 2, the high-frequency power RF (HF) and low frequency power, instead of the direct-current power, may be applied to the upper electrode 15 at step S16.

<Examples of Effects>

As described above, in the plasma processing method of the present embodiment, a film that functions as a target material is formed on the upper electrode 15, and the film is sputtered to form a uniform thin film on a pattern formed on the wafer W. This method makes it possible to control the width of a mask, and in the next step, perform fine processing on the wafer W using the width-controlled mask.

The plasma processing method of the present embodiment also makes it possible to form a film for which no target material suitable to be place beforehand in a chamber, by forming a film to be used as a target material on the upper electrode 15. Thus, the plasma processing method makes it possible to perform sputter deposition regardless of the type of target material.

With the related-art CVD method, the thickness of a film to be formed on a pattern varies depending on the density of the pattern. Therefore, with the related-art CVD method, it is difficult to meet the feature demand for finer wafer processing. On the other hand, the plasma processing method of the present embodiment makes it possible to form a uniform thin film regardless of the density of a pattern. Thus, the plasma processing method of the present embodiment makes it possible to perform fine processing on a wafer in a manner that satisfies current and future demands for miniaturization.

Also according to the present embodiment, film deposition on the upper electrode 15, sputtering, etching, and cleaning can be performed in the chamber 12 of the same plasma processing apparatus 10. Accordingly, the present embodiment makes it possible to reduce apparatus costs.

A plasma processing apparatus and a plasma processing method according to an embodiment are described above. However, the present invention is not limited to the specifically disclosed embodiment, and variations and modifications may be made without departing from the scope of the present invention.

For example, the plasma processing method of the above embodiment may be performed not only by a capacitively-coupled plasma (CCP) apparatus, but also by other types of plasma processing apparatuses. Examples of other types of plasma processing apparatuses include an inductively-coupled plasma (ICP) apparatus, a chemical vapor deposition (CVD) apparatus using a radial line slot antenna, a helicon wave plasma (HWP) apparatus, and an electron cyclotron resonance (ECR) plasma apparatus.

A plasma processing apparatus according to an aspect of this disclosure includes a first high-frequency power supply that supplies first high-frequency power to an upper electrode, and at least one of a direct-current power supply that applies direct-current power to the upper electrode and a second high-frequency power supply that applies second high-frequency power with a frequency lower than that of the first high-frequency power to the upper electrode.

The present invention may be applied not only to a plasma processing apparatus for processing a wafer, but also to a plasma processing apparatus for processing a large-size substrate for a flat panel display, an EL element, or a substrate for a solar battery.

What is claimed is:

1. A method performed by a plasma processing apparatus including a first electrode on which a substrate is placeable, a second electrode disposed to face the first electrode across a predetermined gap and including a facing surface facing the first electrode, and a chamber housing the first electrode and the second electrode, the method comprising:
   placing the substrate on the first electrode;
   generating first plasma to form a film of a reaction product on the facing surface of the second electrode by supplying high-frequency power to the second electrode and supplying a first gas through gas holes formed in the facing surface into the chamber;
   generating second plasma to sputter the film of the reaction product on the facing surface of the second electrode and thereby form a film on a mask formed on the substrate by
      supplying the high-frequency power and direct-current power to the second electrode and supplying a second gas through the gas holes formed in the facing surface into the chamber, or
      supplying the high-frequency power to the second electrode, supplying high-frequency power to the first electrode, and supplying a second gas through the gas holes formed in the facing surface into the chamber, the high-frequency power supplied to the first electrode having a frequency lower than a frequency of the high-frequency power supplied to the second electrode; and
   etching the substrate using the mask on which the film is formed.

2. The method as claimed in claim 1, wherein the gap between the first electrode and the second electrode is greater than or equal to 80 mm.

3. The method as claimed in claim 1, wherein the film of the reaction product is a silicon-containing film or a carbon-containing film.

4. The method as claimed in claim 1, wherein the film of the reaction product on the facing surface of the second electrode is sputtered in the same chamber where the film of the reaction product is formed on the facing surface of the second electrode, to form the film on the mask formed on the substrate placed on the first electrode.

5. The method as claimed in claim 1, wherein the film is formed on the mask formed on the substrate to decrease a diameter of a hole or a width of a line formed in the mask.

6. The method as claimed in claim 5, wherein the decreased diameter of the hole or the decreased width of the line is finer than a diameter of a hole or a width of a line formable by lithography.

7. The method as claimed in claim 5, wherein the diameter of the hole or the width of the line is controlled by a time for which the direct-current power is supplied to the second electrode.

8. The method as claimed in claim 1, wherein the second electrode is formed of silicon, and the direct-current power is supplied to the second electrode.

9. The method as claimed in claim 1, wherein formation of the film of the reaction product on the facing surface of the second electrode, sputtering of the film of the reaction product, and the etching of the substrate are performed consecutively in the same chamber.

* * * * *